United States Patent
Kurata et al.

(10) Patent No.: US 11,381,066 B2
(45) Date of Patent: Jul. 5, 2022

(54) RESIN STRUCTURE

(71) Applicant: Yazaki Corporation, Tokyo (JP)

(72) Inventors: Sho Kurata, Makinohara (JP); Hideki Kawamura, Makinohara (JP); Minoru Umezaki, Makinohara (JP); Naoki Tozuka, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 407 days.

(21) Appl. No.: 16/787,285

(22) Filed: Feb. 11, 2020

(65) Prior Publication Data

US 2020/0295551 A1    Sep. 17, 2020

(30) Foreign Application Priority Data

Mar. 11, 2019   (JP) .............................. JP2019-044089

(51) Int. Cl.
| | |
|---|---|
| *H02G 3/08* | (2006.01) |
| *H05K 5/02* | (2006.01) |
| *B60R 16/023* | (2006.01) |
| *B60R 16/02* | (2006.01) |

(52) U.S. Cl.
CPC ......... *H02G 3/088* (2013.01); *B60R 16/0239* (2013.01); *H05K 5/0221* (2013.01); *B60R 16/02* (2013.01)

(58) Field of Classification Search
CPC ... B60R 16/0239; H02G 3/088; H05K 5/0221
See application file for complete search history.

(56) References Cited

U.S. PATENT DOCUMENTS

| | | | |
|---|---|---|---|
| 2004/0007379 A1* | 1/2004 | Suzuki | B60R 16/0239 174/59 |
| 2012/0097693 A1* | 4/2012 | Takeuchi | B60R 16/0239 220/810 |
| 2014/0020948 A1* | 1/2014 | Kamigaichi | B60R 16/0239 174/535 |
| 2018/0277328 A1* | 9/2018 | Kawarazaki | H01M 50/502 |
| 2019/0273372 A1* | 9/2019 | Hikosaka | H02G 3/16 |
| 2019/0376542 A1* | 12/2019 | Kawamura | B60R 16/0238 |
| 2019/0379194 A1* | 12/2019 | Kawamura | H02G 3/16 |
| 2020/0335956 A1* | 10/2020 | Miyamoto | H02G 3/081 |

FOREIGN PATENT DOCUMENTS

| | | |
|---|---|---|
| EP | 1 914 843 A1 | 4/2008 |
| JP | 6-88133 U | 12/1994 |
| JP | 2008-99392 A | 4/2008 |
| JP | 2016-208671 A | 12/2016 |
| JP | 2017-022824 A | 1/2017 |
| JP | 2018-107952 A | 7/2018 |

* cited by examiner

*Primary Examiner* — Hung V Ngo
(74) *Attorney, Agent, or Firm* — Sughrue Mion, PLLC

(57) ABSTRACT

A resin structure includes a first resin body, having an annular first side wall portion, a second resin body having a second side wall portion, and a third resin body having an annular third side wall portion. The second resin body is assembled to the first resin body, such that an upper edge of the second side wall portion and at least a portion of an annular lower edge of the first side wall portion in a circumferential direction are aligned. The third resin body is assembled to the second resin body, such that an annular upper edge of the third side wall portion and at least a lower edge of the second side wall portion are aligned.

5 Claims, 8 Drawing Sheets

RESIN STRUCTURE

CROSS REFERENCE TO RELATED APPLICATIONS

This application claims priority from Japanese Patent Application No. 2019-044089 filed on Mar. 11, 2019, the entire contents of which are incorporated herein by reference.

BACKGROUND OF THE INVENTION

Field of the Invention

The present invention relates to a resin structure.

Description of Related Art

A resin structure including a plurality of resin bodies assembled to each other such as a relay box (an electric connection box) mounted on a vehicle is widely known in the related art.

[Patent Literature 1] JP-A-2017-022824

In the resin structure described above, a gap may occur in alignment portions between the resin bodies assembled to each other due to relative movement (backlash) between the resin bodies. Accordingly, in a case of high pressure cleaning of blowing water to such a resin structure from outside (hereinafter, simply referred to as "high pressure cleaning"), water is likely to enter the resin structure through the gap. It is desirable to prevent such entering of water.

SUMMARY

One or more embodiments provide a resin structure capable of preventing relative movement (backlash) between resin bodies assembled to each other and preventing water from entering the resin structure via a gap in an alignment portion between the resin bodies.

In an aspect (1), one or more embodiments provide a resin structure including a first resin body having an annular first side wall portion, a second resin body having a second side wall portion, and a third resin body having an annular third side wall portion. The second resin body is assembled to the first resin body, such that an upper edge of the second side wall portion and at least a portion of an annular lower edge of the first side wall portion in a circumferential direction are aligned. The third resin body is assembled to the second resin body, such that an annular upper edge of the third side wall portion and at least a lower edge of the second side wall portion are aligned. One resin body of the first resin body and the third resin body may include an extension piece extending toward the other resin body of the first resin body and the third resin body across an outer side of the second side wall portion. The other resin body includes a locking portion that locks a distal end portion of the extension piece. The second side wall portion of the second resin body includes a holding portion that holds a portion of the extension piece located outside the second side wall portion.

In an aspect (2), the holding portion may have a through hole into which the extension piece is inserted.

In an aspect (3), the locking portion may be a concave portion formed on the side wall portion of the other resin body.

In an aspect (4), the extension piece and the holding portion include a lock mechanism that prevents separation of the extension piece from the holding portion.

In an aspect (5), the second resin body (7) is assembled to the first resin body (2) such that the upper edge of the second side wall portion (21) and a portion of the annular lower edge of the first side wall portion (11) in the circumferential direction are aligned. The third resin body (8) is assembled to the first resin body (2) and the second resin body (7) such that the annular upper edge of the third side wall portion (31) and an annular lower edge including a part other than the portion of the annular lower edge of the first side wall portion (11) in the circumferential direction and the lower edge of the second side wall portion (21) are aligned.

According to the aspect (1), a resin structure has a structure in which the second side wall portion is interposed between the first side wall portion and the third side wall portion. Accordingly, relative movement (backlash) is likely to occur between the first side wall portion and the second side wall portion, and between the second side wall portion and the third side wall portion. A portion of the extension piece, which extends from the one resin body of the first resin body and the third resin body and is locked to the locking portion of the other resin body, is held by the holding portion of the second resin body. In other words, the second resin body is held (fixed) at an intermediate portion of the extension piece whose distal end portion and base end portion are fixed by the first resin body and the third resin body, respectively. Therefore, relative movement (backlash) is less likely to occur between the first side wall portion and the second side wall portion and between the second side wall portion and the third side wall portion, and gaps due to the relative movement (backlash) is less likely to occur in the alignment portion between the first side wall portion and the second side wall portion or the alignment portion between the second side wall portion and the third side wall portion. This makes it less likely for water to enter the resin structure through these gaps.

The third resin body can be assembled to the second resin body (and the first resin body) with the state in which the second resin body is assembled to the first resin body and the extension piece is held by the holding portion maintained. As a result, the third resin body can be assembled to the second resin body (and the first resin body) easily.

In the aspect (1), another aspect in addition to the aspect (5) may also be included, in which the second resin body is assembled to the first resin body such that the annular upper edge of the annular second side wall portion and the annular lower edge of the first side wall portion are aligned, and the third resin body is assembled to the second resin body such that the annular upper edge of the third side wall portion and the annular lower edge of the annular second side wall portion are aligned.

According to the aspect (2), the extension piece can be held by the holding portion by simply penetrating the extension piece into the through hole provided in the holding portion.

According to the aspect (3), the distal end portion of the extension piece can be locked to the locking portion simply by fitting the distal end portion of the extension piece into the recess portion.

According to the aspect (4), the extension piece and the holding portion have a lock function of preventing separation between the first side wall portion and the third side wall portion, so that the extension piece and the holding portion can also be used as a part of the lock mechanism that prevents separation between the first resin body and the third resin body.

According to the aspect (5), the second side wall portion is interposed between the first side wall portion and the third side wall portion only in a portion of the resin structure in the circumferential direction and the first side wall portion and the third side wall portion are directly assembled in a portion other than the portion of the resin structure in the circumferential direction. Accordingly, relative movement (backlash) is likely to occur only in the portion in the circumferential direction between the first side wall portion and the second side wall portion and between the second side wall portion and the third side wall portion. Also in such a structure, according to the present invention, relative movement (backlash) is less likely to occur between the first side wall portion and the second side wall portion and between the second side wall portion and the third side wall portion.

According to one or more embodiments, it is possible to provide a resin structure capable of preventing relative movement (backlash) between resin bodies assembled to each other and preventing water from entering the resin structure via a gap in an alignment portion between the resin bodies.

The present invention is briefly described above. Details of the present invention will be clarified by reading a mode for carrying out the present invention described below with reference to the accompanying drawings.

DETAILED DESCRIPTION

Embodiment

Figure 1:
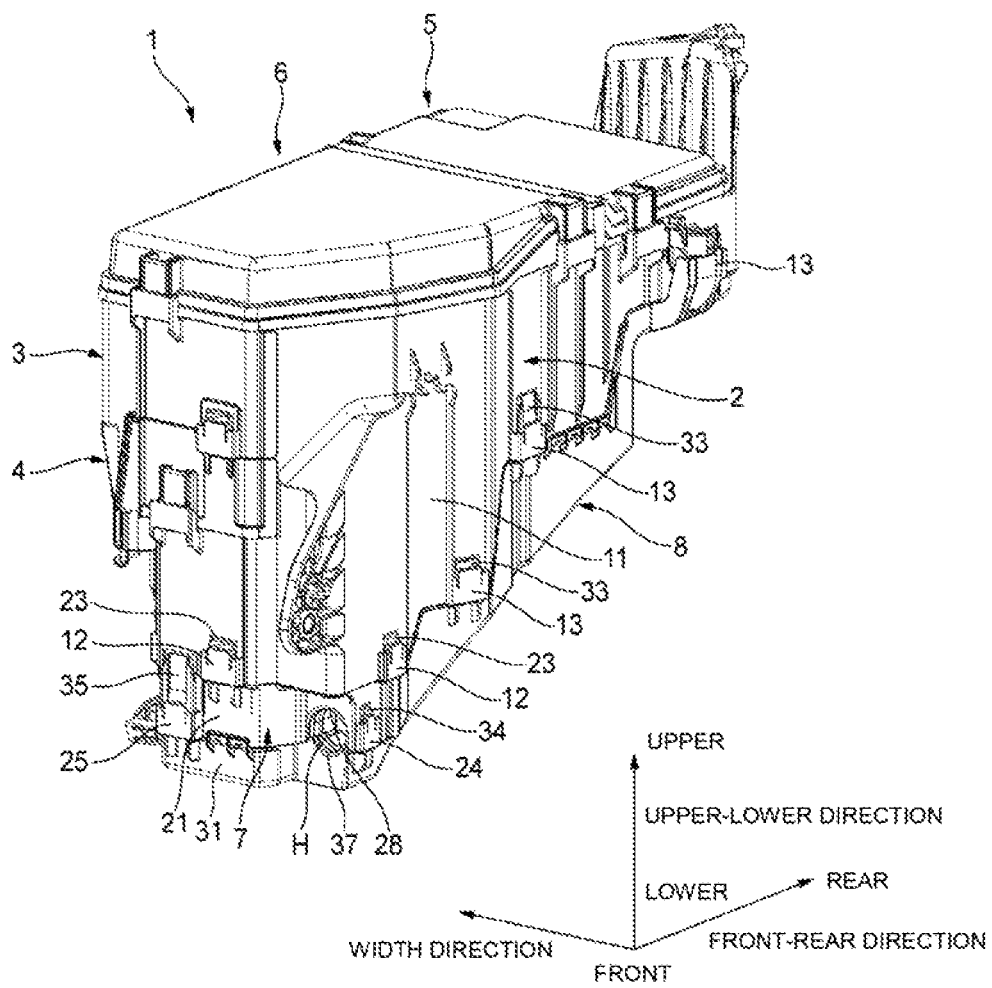
FIG. 1 is a perspective view of a resin structure according to an embodiment.

Hereinafter, a resin structure 1 according to an embodiment of the present invention shown in FIG. 1 will be described with reference to the drawings. The resin structure 1 is typically a relay box (an electric connection box) that is mounted on a vehicle and accommodates electronic components such as a relay. Hereinafter, "front-rear direction", "width direction", "up-lower direction", "front", "rear", "upper", and "lower" are defined as is shown in FIG. 1 for convenience of description. The "front-rear direction", the "width direction", and the "upper-lower direction" are orthogonal to one another. When the resin structure 1 is mounted on the vehicle, the "front-rear direction", the "width direction", and the "upper-lower direction" correspond to the front-rear direction, the width direction, and the upper-lower direction of the vehicle, respectively.

Figure 2:
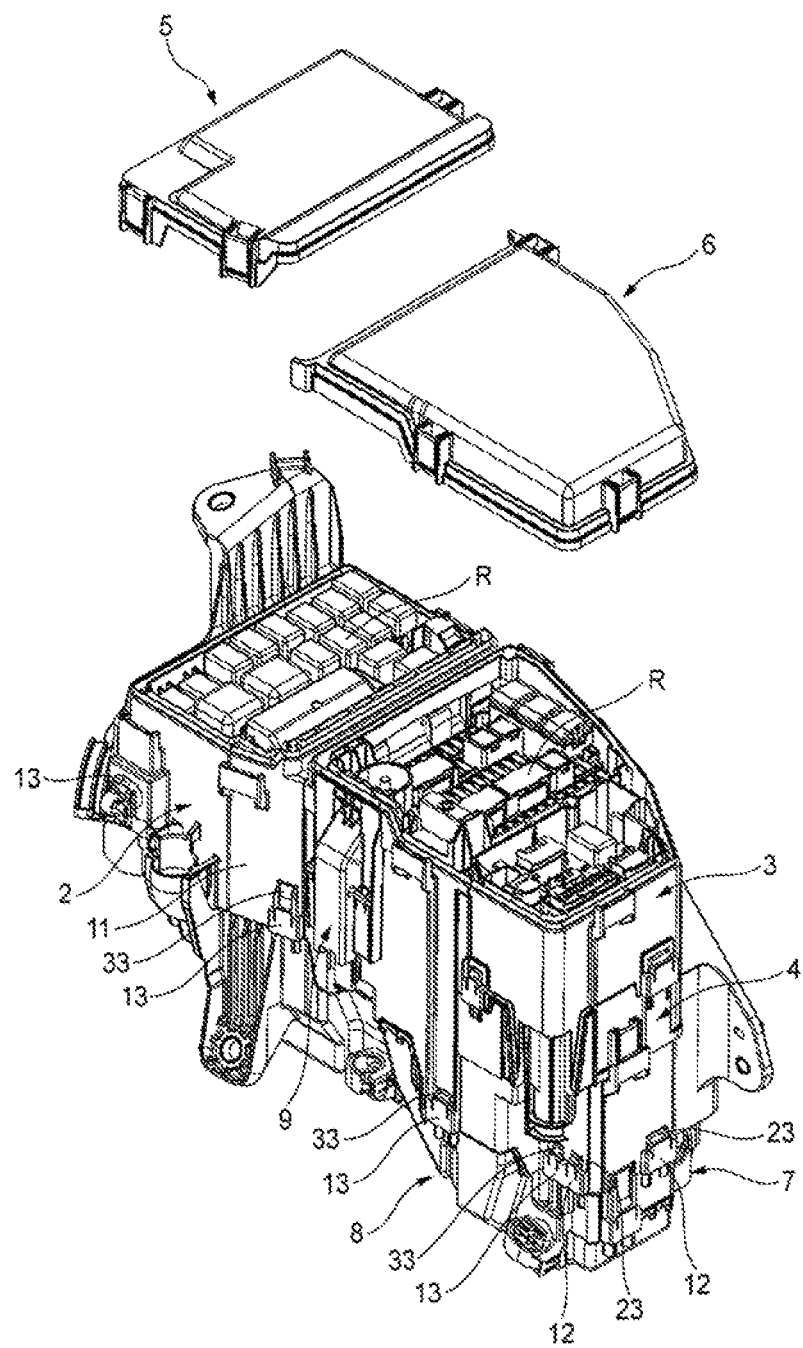
FIG. 2 is a perspective view of the resin structure in which only a first upper cover and a second upper cover are disassembled.

As shown in FIGS. 1 and 2, the resin structure 1 includes a frame 2, a first front cover 3 and a second front cover 4 assembled above a front end portion of the frame 2, a first upper cover 5 assembled above the frame 2 to block an upper opening of a rear region of the frame 2, a second upper cover 6 assembled above the frame 2 and the first front cover 3 to block an upper opening of a front region of the frame 2 and the first front cover 3, an under cover 7 assembled below the front end portion of the frame 2, a lower cover 8 assembled below the frame 2 and under cover 7 to block lower openings of the frame 2 and the under cover 7, and a side cover 9 assembled to an outer surface (a side surface) of the frame 2 on its one side in the width direction. All the eight components in the resin structure 1 are resin molded bodies.

As shown in FIG. 2, electronic components (and other components) R such as a relay are accommodated inside the frame 2 and the first front cover 3 (and the second front cover 4). The present invention relates to structures of the frame 2, the under cover 7, and the lower cover 8 of the resin structure 1. Accordingly, only the structures of the frame 2 the under cover 7, and the lower cover 8 will be described in detail below.

Figure 3:
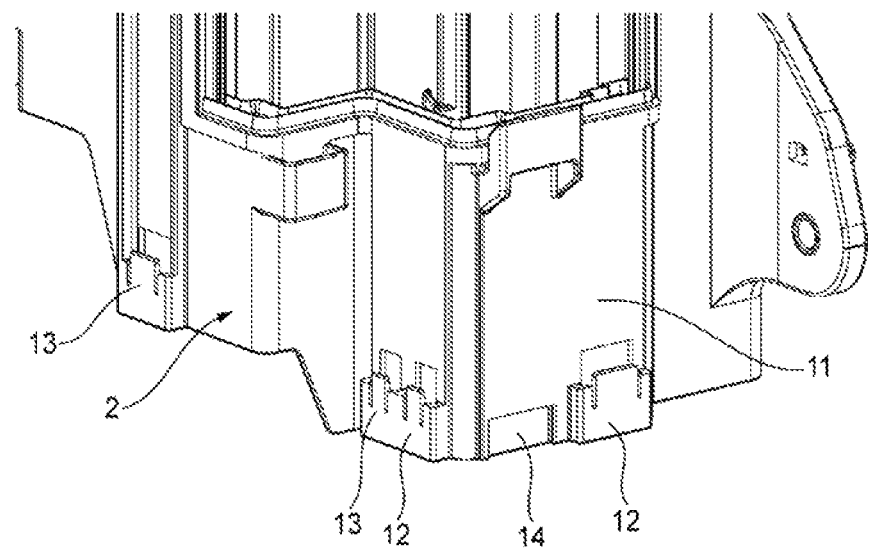
FIG. 3 is an enlarged perspective view of a front end portion of a frame.

The frame 2 will be described first. As shown in FIGS. 1 to 3, the frame 2 includes an annular side wall portion 11 constituting most of the appearance of a side surface of the resin structure 1. The side wall portion 11 is integrally provided with a locking portion 12 on outer surfaces of a plurality of positions (three positions in the present embodiment) on a front end portion of a lower end portion of the side wall portion 11. The locking portion 12 has a through hole extending in the upper-lower direction. The locking portion 12 has a function of assembling the under cover 7 to the frame 2.

The side wall portion 11 is integrally provided with a locking portion 13 on outer surfaces of a plurality of positions (eight positions in the present embodiment) on the lower end portion of the side wall portion 11 in the circumferential direction. The locking portion 13 has a through hole extending in the upper-lower direction. The locking portion 13 has a function of assembling the lower cover 8 to the frame 2.

As shown in FIG. 3, the side wall portion 11 is provided with a rectangular concave portion 14 on an outer surface of one position on the lower end portion of the side wall portion 11. The concave portion 14 is recessed and opened in the thickness direction of the side wall portion 11. The concave portion 14 has a function of fitting and locking a distal end portion of an extension piece 35 of the lower cover 8 described below.

Figure 4:
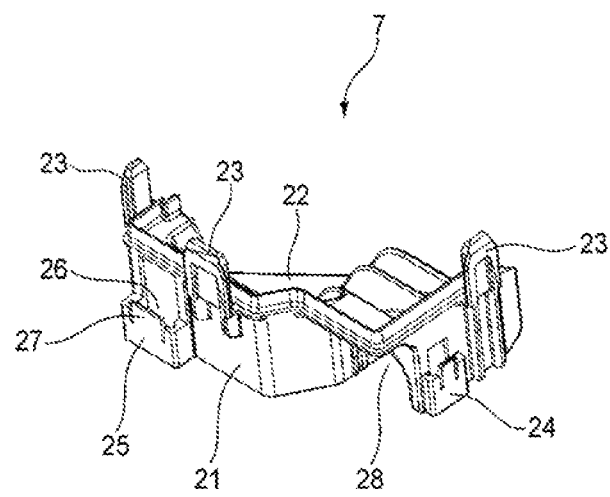
FIG. 4 is a perspective view of an under cover.
Figure 5:
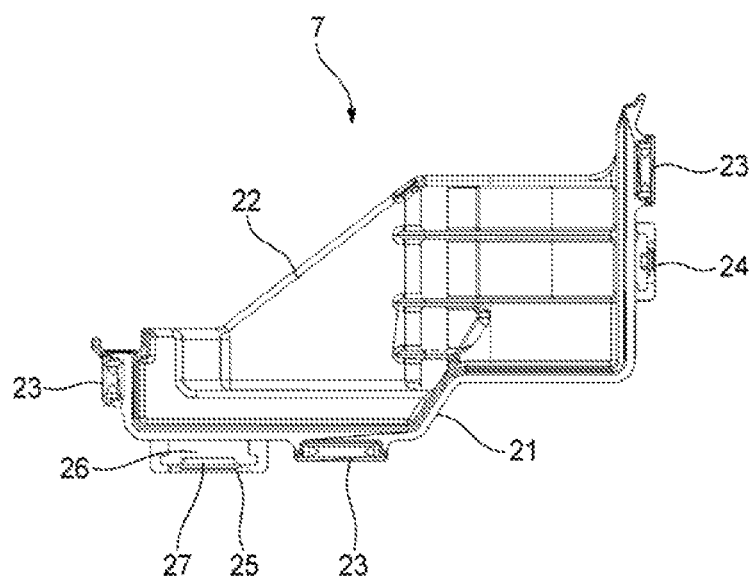
FIG. 5 is a plan view of the under cover.

Next, the under cover 7 will be described. As shown in FIGS. 4 and 5, the under cover 7 includes a side wall portion 21. An upper edge of the side wall portion 21 has a shape corresponding to a front end portion (a portion in the circumferential direction) of an annular lower edge of the side wall portion 11 of the frame 2. The side wall portion 21 is integrally provided with a flat plate-shaped protrusion 22 protruding in the horizontal direction from an inner surface of the side wall portion 21 toward the inside of the resin structure 1.

The side wall portion 21 is integrally provided with a locking piece 23 extending upward on outer surfaces of a plurality of positions (three positions in the present embodiment) on an upper end portion of the side wall portion 21 in the circumferential direction. The locking piece 23 has a function of assembling the under cover 7 to the frame 2.

The side wall portion 21 is integrally provided with a locking portion 24 on an outer surface of one position on a lower end portion of the side wall portion 21. The locking portion 24 has a through hole extending in the upper-lower direction. The locking portion 24 has a function of assembling the lower cover 8 to the under cover 7.

The side wall portion 21 is integrally provided with a holding portion 25 on an outer surface of another position on the lower end portion of the side wall portion 21. The holding portion 25 has a through hole 26 extending in the upper-lower direction. The holding portion 25 has a function of holding the extension piece 35 of the lower cover 8. The holding portion 25 is provided with a locking claw 27 that locks a locking step portion 36 provided on the extension piece 35 of the lower cover 8 described below.

The under cover 7 has a semi-cylindrical groove 28 opened downward at a lower end portion thereof. The groove 28 has a function constituting an upper part of an inner wall defining an insertion hole H (see FIGS. 1 and 8) through which electric wires (not shown) led out from the inside of the resin structure 1 are inserted.

Figure 6:
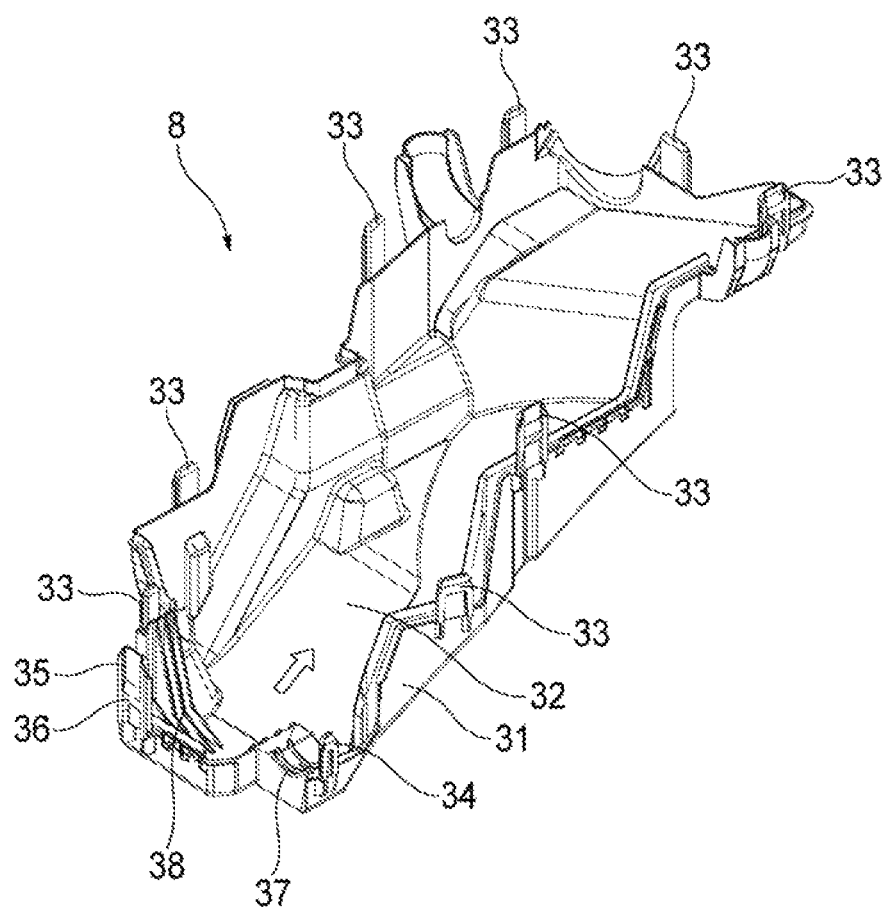
FIG. 6 is a perspective view of a lower cover.
Figure 7:
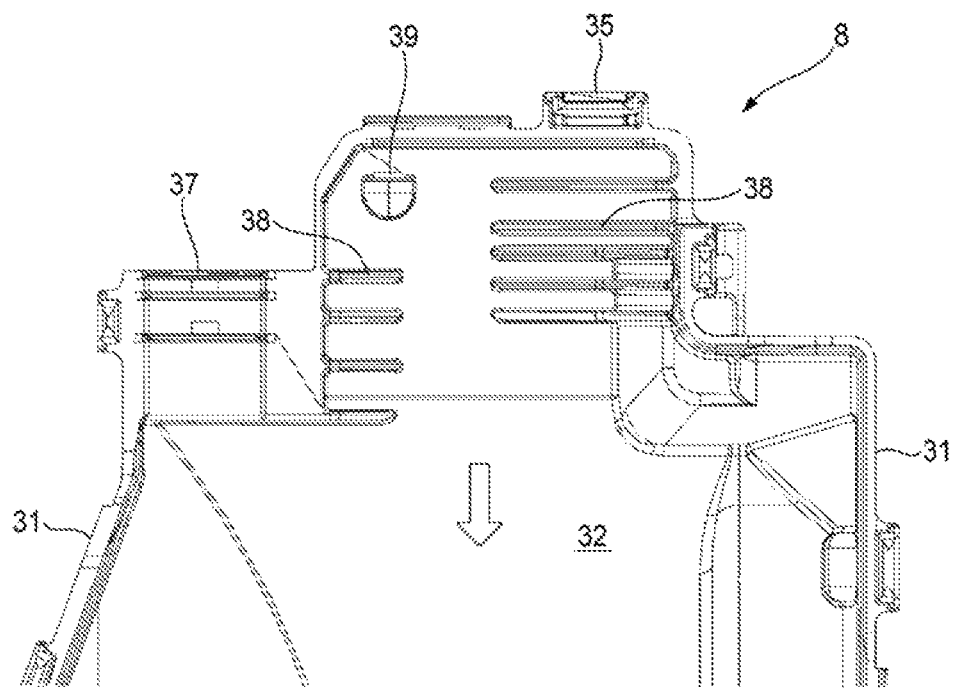
FIG. 7 is an enlarged plan view of a front end portion of the lower cover.

Next, the lower cover 8 will be described. As shown in FIGS. 6 and 7, the lower cover 8 integrally includes an annular side wall portion 31 constituting most of the appearance of a lower side surface of the resin structure 1, and a bottom wall portion 32 constituting most of the appearance of a bottom surface of the resin structure 1. The bottom wall portion 32 blocks an annular lower opening of the side wall portion 31.

An annular upper edge of the side wall portion 31 has a shape corresponding to an annular lower edge constituted by (i) a part other than the front end portion (the portion in the circumferential direction), to which the under cover 7 is assembled, of the annular lower edge of the side wall portion 11 of the frame 2 and (ii) a lower edge of the under cover 7.

The bottom wall portion 32 has a shape inclined upward from front to rear. Accordingly, an inner surface of the bottom wall portion 32 also has a shape inclined upward from front to rear.

The side wall portion 31 is integrally provided with a locking piece 33 extending upward on outer surfaces of a plurality of positions (eight positions in the present embodiment) on an upper end portion of the side wall portion 31 in the circumferential direction. The locking piece 33 has a function of assembling the lower cover 8 to the frame 2.

The side wall portion 31 is integrally provided with a locking piece 34 extending upward on an outer surface of one position on a front end portion of the upper end portion of the side wall portion 31. The locking piece 34 has a function of assembling the lower cover 8 to the under cover 7.

The side wall portion 31 is integrally provided with the extension piece 35 extending upward on an outer surface of another position on the front end portion of the upper end portion of the side wall portion 31. As will be described below, the extension piece 35 has a function of holding the under cover 7 in cooperation with the concave portion 14 of the frame 2. The extension piece 35 includes the locking step portion 36 on an outer surface thereof. The extension height of the extension piece 35 is larger than the protruding height of the locking pieces 33, 34.

The lower cover 8 has a semi-cylindrical groove 37 opened upward at an upper end portion of a front end portion thereof. The groove 37 has a function of constituting a lower part of the inner wall defining the insertion hole H (see FIGS. 1 and 8) through which electric wires (not shown) led out from the inside of the resin structure 1 are inserted.

The bottom wall portion 32 is provided with a plurality of ribs 38 in an internal space defined by the side wall portion 31 and the bottom wall portion 32 at a front end portion of the bottom wall portion 32. The plurality of ribs 38 protrude upward from the inner surface of the bottom wall portion 32. In particular, in the present embodiment as is shown in FIG. 7, a plurality of ribs 38 extending in the width direction from the side wall portion 31 on one side in the width direction to the other side in the width direction are arranged side by side in the front-rear direction. A plurality of ribs 38 extending in the width direction from the side wall portion 31 on the other side in the width direction to the one side in the width direction are also arranged side by side in the front-rear direction. The function of the ribs 38 will be described below.

The bottom wall portion 32 has a water drain hole 39 in a position of the front end portion of the bottom wall portion 32 that does not interfere with the ribs 38. The water drain hole 39 penetrates in the upper-lower direction. The structures of the frame 2, the under cover 7, and the lower cover 8 are described above.

Next, procedures for assembling the frame 2, the under cover 7, and the lower cover 8 will be described. When assembling the frame 2, the under cover 7, and the lower cover 8, the under cover 7 is first assembled to the frame 2. To assemble the under cover 7 to the frame 2, a plurality of locking pieces 23 (see FIG. 4) of the under cover 7 are inserted and locked to through holes of a plurality of locking portions 12 of the frame 2 from below. Accordingly, as shown in FIG. 8, the under cover 7 is assembled to the frame 2 such that the upper edge of the side wall portion 21 of the under cover 7 and the front end portion (the portion in the circumferential direction) of the annular lower edge of the annular side wall portion 11 of the frame 2 are aligned.

Next, the lower cover 8 is assembled to the frame 2 and the under cover 7. To assemble the lower cover 8 to the frame 2 and the under cover 7, the extension piece 35 (see FIG. 6) of the lower cover 8 is first inserted into the through hole 26 (see FIG. 4) of the holding portion 25 of the under cover 7 from below. Next, with the state in which the extension piece 35 is inserted into the through hole 26 (that is, the extension piece 35 is held by the holding portion 25) maintained, one locking piece 34 of the lower cover 8 is inserted and locked to a through hole of one locking portion 24 of the under cover 7, a plurality of locking pieces 33 of the lower cover 8 are respectively inserted and locked to through holes of a plurality of locking portions 13 of the frame 2, and the locking step portion 36 of the extension piece 35 is locked to the locking claw 27 of the holding portion 25. In this way, the lower cover 8 can be assembled to the frame 2 and the under cover 7 with the state in which the extension piece 35 is held by the holding portion 25 maintained. Accordingly, this operation can be easily performed.

Figure 8:
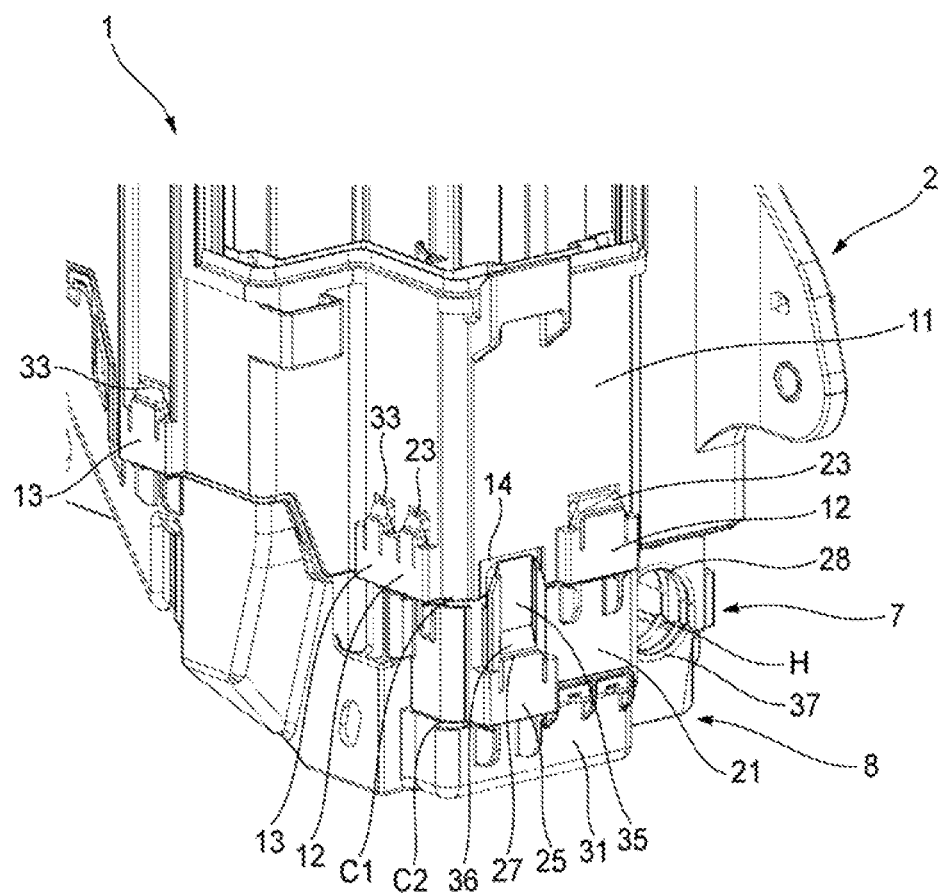
FIG. 8 is a perspective view showing a state in which the frame, the under cover, and the lower cover are assembled to each other.

Accordingly, as shown in FIG. 8, the lower cover 8 is assembled to the frame 2 and the under cover 7 such that the annular upper edge of the annular side wall portion 31 of the lower cover 8 and the annular lower edge constituted by (i) the part other than the front end portion (the portion in the circumferential direction), to which the under cover 7 is assembled, of the annular lower edge of the side wall portion 11 of the frame 2 and (ii) the lower edge of the side wall portion 21 of the under cover 7 are aligned. Accordingly, the assembly of the frame 2, the under cover 7, and the lower cover 8 is completed.

When the assembly of the frame 2, the under cover 7, and the lower cover 8 is completed (an assembly completed state), as shown in FIG. 8, the insertion hole H into which electric wires (not shown) are inserted is defined by the groove 28 of the under cover 7 and the groove 37 of the lower cover 8.

Figure 9:
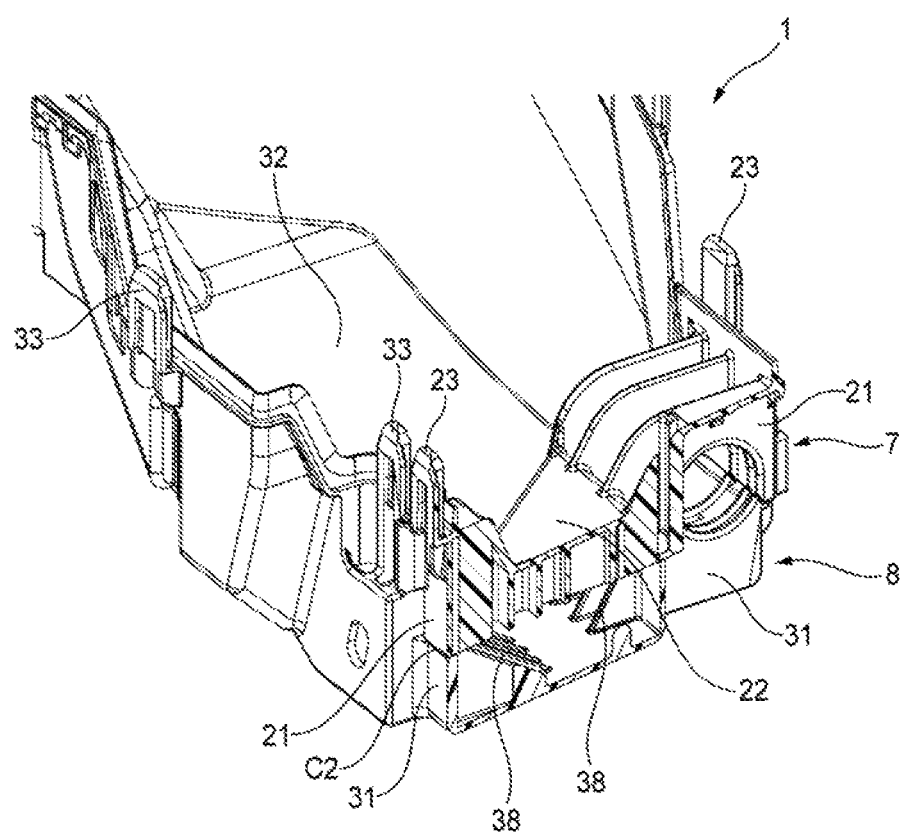
FIG. 9 shows a positional relationship between a rib of the lower cover and a protrusion of the under cover.

In the assembly completed state, as shown in FIG. 9, the protrusion 22 of the under cover 7 is located above a plurality of ribs 38 of the lower cover 8. A function of the arrangement relationship between the ribs 38 and the protrusion 22 will be described below.

The resin structure 1 has a structure in which the under cover 7 is interposed between the frame 2 and the lower cover 8. Accordingly, relative movement (backlash) is likely to occur between the frame 2 and the under cover 7 and between the under cover 7 and the lower cover 8. Therefore, gaps due to the relative movement (backlash) may occur in an alignment portion C1 (see FIG. 8) between the side wall portion 11 and the side wall portion 21 or an alignment portion C2 (see FIG. 8) between the side wall portion 21 and the side wall portion 31. When high pressure cleaning is performed to the resin structure 1 from a front side, water is likely to enter the internal space defined by the bottom wall portion 32 and the side wall portion 31 of the lower cover 8 via such gaps. When water entering the inner space has a large flow velocity, the water may splash on the inner surfaces of the bottom wall portion 32 and the side wall portion 31 (see white arrows in FIGS. 6 and 7) and contact the electronic components R provided on the upper side in the resin structure 1.

For this reason, the resin structure 1 is provided with the plurality of ribs 38 on the inner surface of the lower cover 8. Accordingly, water entering the inner surface of the bottom wall portion 32 in the internal space from the front side collides with the plurality of ribs 38 so that the water flow can be prevented. Therefore, the entering water can be prevented from splashing on the inner surfaces of the bottom wall portion 32 and the side wall portion 31 and the waterproof property for the electronic components R provided on the upper side in the resin structure 1 can be enhanced.

In addition, splashing water above the ribs 38 due to the collision with the ribs 38 collides with the protrusion 22 of the under cover 7 located above the ribs 38 so that the water can be prevented from moving upward further from the protrusion 22. As a result, the waterproof property for the electronic components R located above the protrusion 22 of the under cover 7 can be enhanced. The function of the arrangement relationship between the ribs 38 and the protrusion 22 is described above.

In the assembly completed state, the distal end portion of the extension piece 35 of the lower cover 8 held by the holding portion 25 of the under cover 7 is locked to the concave portion 14 of the frame 2 by being fitted into the concave portion 14. In other words, the under cover 7 is held (fixed) at an intermediate portion of the extension piece 35 whose base end portion and distal end portion are fixed by the frame 2 and the lower cover 8, respectively. Therefore, relative movement (backlash) is less likely to occur between the frame 2 and the under cover 7 and between the under cover 7 and the lower cover 8, and gaps due to the relative movement (backlash) is less likely to occur in the alignment portion C1 between the side wall portion 11 of the frame 2 and the side wall portion 21 of the under cover 7 and the alignment portion C2 between the side wall portion 21 of the under cover 7 and the side wall portion 31 of the lower cover 8. This makes it less likely for water to enter the resin structure 1 through these gaps.

Functions and Effects

The resin structure 1 according to the embodiment of the present invention has a structure in which the under cover 7 is interposed between the frame 2 and the lower cover 8. Accordingly, relative movement (backlash) is likely to occur between the frame 2 and the under cover 7 and between the under cover 7 and the lower cover 8. In this regard, according to the resin structure 1, a part of the extension piece 35 extending from the lower cover 8 and locked in the recess 14 of the frame 2 is held by the holding portion 25 of the under cover 7. In other words, the under cover 7 is held (fixed) at the intermediate portion of the extension piece 35 whose base end portion and distal end portion are fixed by the frame 2 and the lower cover 8, respectively. Therefore, relative movement (backlash) is less likely to occur between the frame 2 and the under cover 7 and between the under cover 7 and the lower cover 8, and gaps due to the relative movement (backlash) is less likely to occur in the alignment portion C1 between the side wall portion 11 of the frame 2 and the side wall portion 21 of the under cover 7 and the alignment portion C2 between the side wall portion 21 of the under cover 7 and the side wall portion 31 of the lower cover 8. This makes it less likely for water to enter the resin structure 1 through these gaps.

The lower cover 8 can be assembled to the frame 2 and the under cover 7 with the state in which the under cover 7 is assembled to the frame 2 and the extension piece 35 is held by the holding portion 25 maintained. As a result, the lower cover 8 can be assembled to the frame 2 and the under cover 7 easily.

Other Embodiments

The present invention is not limited to the above embodiment and various modifications can be adopted within the scope of the present invention. For example, the present invention may be appropriately modified, improved or the like. In addition, materials, shapes, dimensions, numbers, arrangement locations and the like of elements in the above embodiment are optional and not limited as long as the object of the present invention can be achieved.

In the above embodiment, the under cover 7 is interposed between the frame 2 and the lower cover 8 only in a portion of the resin structure 1 in the circumferential direction and the frame 2 and the lower cover 8 are directly assembled in a portion other than the portion of the resin structure 1 in the circumferential direction. In contrast, the under cover 7 may be interposed between the frame 2 and the lower cover 8 over the entire circumference of the resin structure 1 in the circumferential direction. In this case, the under cover 7 is assembled to the frame 2 such that the annular upper edge of the side wall portion 21 of the annular under cover 7 and the annular lower edge of the side wall portion 11 of the frame 2 are aligned, and the lower cover 8 is assembled to the under cover 7 such that the annular upper edge of the side wall portion 31 of the lower cover 8 and the annular lower edge of the annular side wall portion 21 are aligned.

The above embodiment adopts the holding portion 25, which defines the through hole 26 and has a substantially U-shaped cross section in the horizontal direction, as the "holding portion" of the present invention (see FIG. 5). In contrast, a holding portion that defines a groove in the width direction and has a substantially L-shaped cross section in the horizontal direction may be adopted as the "holding portion" of the present invention. In this case, the extension piece 35 can be held by the holding portion by inserting the extension piece into the groove provided in the holding portion.

The above embodiment adopts the rectangular concave portion 14, which is recessed in the thickness direction of the side wall portion 11 of the frame 2 and opened downward, as the "locking portion" of the present invention (see FIG. 3). In contrast, the "locking portion" of the present invention may have any shape as long as the distal end portion of the extension piece 35 can be locked, for example, a locking hole extending in the upper-lower direction and opened downward to allow insertion of the distal end portion of the extension piece 35.

In the above embodiment, the extension piece 35 extending upward is provided on the lower cover 8 and the locking portion 14 that locks the distal end portion of the extension piece 35 is provided on the frame 2. However, an "extension piece" extending downward may be provided on the frame 2 and a "locking portion" that locks a distal end portion of the "extension piece" may be provided on the lower cover 8.

In the above embodiment, the resin structure 1 is a relay box (an electric junction box) that accommodates a plurality of electronic components R, but the resin structure 1 may have functions other than the relay box (the electric junction box).

Here, features of the above embodiment of the resin structure 1 according to the present invention are briefly summarized and listed in the following [1] to [5].

[1] A resin structure (1) comprising:
a first resin body (2) having an annular first side wall portion (11);
a second resin body (7) having a second side wall portion (21); and
a third resin body (8) having an annular third side wall portion (31),
wherein the second resin body (7) is assembled to the first resin body (2), such that an upper edge of the second side wall portion (21) and at least a portion of an annular lower edge of the first side wall portion (11) in a circumferential direction are aligned,
wherein the third resin body (8) is assembled to the second resin body (7), such that an annular upper edge of the third side wall portion (31) and at least a lower edge of the second side wall portion (21) are aligned,
wherein one resin body (8) of the first resin body (2) and the third resin body (8) includes an extension piece (35) extending toward the other resin body (2) of the first resin body (2) and the third resin body (8) across an outer side of the second side wall portion (21),
wherein the other resin body (2) includes a locking portion (14) that locks a distal end portion of the extension piece (35), and
wherein the second side wall portion (21) of the second resin body (7) includes a holding portion (25) that holds a portion of the extension piece (35) located outside the second side wall portion (21).

[2] The resin structure (1) according to [1],
wherein the holding portion (25) has a through hole (26) into which the extension piece (35) is inserted.

[3] The resin structure (1) according to [1] or [2],
wherein the locking portion is a concave portion (14) formed on the side wall portion (11) of the other resin body (2).

[4] The resin structure (1) according to any one of [1] to [3],
wherein the extension piece (35) and the holding portion (25) include a lock mechanism (27, 36) that prevents separation of the extension piece (35) from the holding portion (25).

[5] The resin structure (1) according to any one of [1] to [4],
wherein the second resin body (7) is assembled to the first resin body (2) such that the upper edge of the second side wall portion (21) and a portion of the annular lower edge of the first side wall portion (11) the circumferential direction are aligned, and
wherein the third resin body (8) is assembled to the first resin body (2) and the second resin body (7) such that the annular upper edge of the third side wall portion (31) and an annular lower edge including a part other than the portion of the annular lower edge of the first side wall portion (11) in the circumferential direction and the lower edge of the second side wall portion (21) are aligned.

DESCRIPTION OF REFERENCE NUMERALS AND SIGNS

1 Resin structure
2 frame (First resin body)
7 under cover (Second resin body)
8 lower cover (Third resin body)
11 side wall portion (First side wall portion)
14 concave portion (locking portion)
21 side wall portion (second side wall portion))
25 Molding Portion
26 Through hole
27 locking claw
31 side wall portion (third side wall portion)
35 extension piece
36 locking step portion

What is claimed is:

1. A resin structure comprising:
a first resin body having an annular first side wall portion;
a second resin body having a second side wall portion; and
a third resin body having an annular third side wall portion,
wherein the second resin body is assembled to the first resin body, such that an upper edge of the second side wall portion and at least a portion of an annular lower edge of the first side wall portion in a circumferential direction are aligned,
wherein the third resin body is assembled to the second resin body, such that an annular upper edge of the third side wall portion and at least a lower edge of the second side wall portion are aligned,
wherein one resin both of the first resin body and the third resin body includes an extension piece extending toward the other resin body of the first resin body and the third resin body across an outer side of the second side wall portion,
wherein the other resin body includes a locking portion that locks a distal end portion of the extension piece, and
wherein the second side wall portion of the second resin body includes a holding portion that holds a portion of the extension piece located outside the second side wall portion.

2. The resin structure according to claim 1, wherein the holding portion has a through hole into which the extension piece is inserted.

3. The resin structure according to claim 1, wherein the locking portion is a concave portion formed on the side wall portion of the other resin body.

4. The resin structure according to claim 1, wherein the extension piece and the holding portion include a lock mechanism that prevents separation of the extension piece from the holding portion.

5. The resin structure according to claim 1,
wherein the second resin body is assembled to the first resin body such that the upper edge of the second side wall portion and a portion of the annular lower edge of the first side wall portion in the circumferential direction are aligned, and
wherein the third resin body is assembled to the first resin body and the second resin body such that the annular upper edge of the third side wall portion and an annular lower edge including a part other than the portion of the annular lower edge of the first side wall portion in the circumferential direction and the lower edge of the second side wall portion are aligned.

* * * * *